(12) United States Patent
Han

(10) Patent No.: US 7,105,381 B2
(45) Date of Patent: Sep. 12, 2006

(54) WAFER ALIGNMENT METHOD

(75) Inventor: Il Seok Han, Chungcheongbuk-do (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 11/167,960

(22) Filed: Jun. 28, 2005

(65) Prior Publication Data

US 2006/0110906 A1    May 25, 2006

(30) Foreign Application Priority Data

Nov. 23, 2004   (KR) ...................... 10-2004-0096251

(51) Int. Cl.
*H01L 21/44* (2006.01)
(52) U.S. Cl. ............... 438/118; 438/975; 438/E23.179; 257/797
(58) Field of Classification Search ................ 438/107, 438/109, 118, 455, 459, 975, 977; 257/797
See application file for complete search history.

(56) References Cited

U.S. PATENT DOCUMENTS 6,774,477 B1 *   8/2004   Han ........................... 257/686

\* cited by examiner

*Primary Examiner*—Quoc Hoang
(74) *Attorney, Agent, or Firm*—Marshall, Gerstein & Borun LLP

(57) ABSTRACT

The present invention relates to a wafer alignment method. The wafer alignment method includes the steps of forming first bonding pads and first wafer alignment marks of a convex shape on predetermined regions of a first semiconductor substrate in which a first device is formed, forming second bonding pads on predetermined regions of a second semiconductor substrate in which a second device is formed so that they correspond to the first bonding pads, and forming second wafer alignment marks of a hall shape on the predetermined regions of the second semiconductor substrate so that they correspond to the wafer alignment marks of the convex shape, disposing a rear surface of the second semiconductor substrate upwardly, so that the first bonding pads of the first semiconductor substrate and the second bonding pads of the second semiconductor substrate correspond to each other, polishing the rear surface of the second semiconductor substrate to form holes of the second wafer alignment marks through which X-rays to be projected later penetrate, aligning the first semiconductor substrate and the second semiconductor substrate so that the X-rays projected from the X-ray projector penetrate the second wafer alignment marks of the second semiconductor substrate and then reach the wafer alignment marks of the first semiconductor substrate through a X-ray sensing device, which has an X-ray projector and an X-ray detector and is adjacent to the rear surface of the second semiconductor substrate, and performing a thermal process on the first semiconductor substrate and the second semiconductor substrate, which are aligned, to electrically connect the first bonding pads and the second bonding pads.

5 Claims, 6 Drawing Sheets

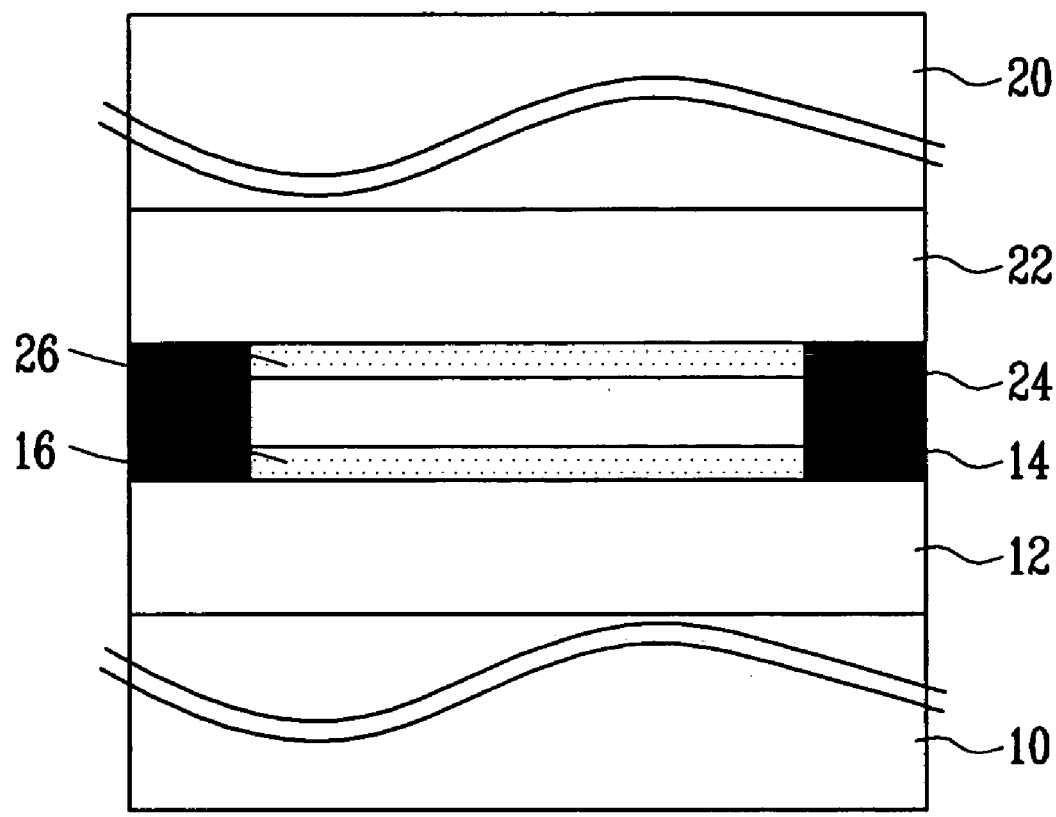

WAFER ALIGNMENT METHOD

BACKGROUND

1. Field of the Invention

The present invention relates to a method of manufacturing semiconductor devices, and more specifically, to a wafer alignment method.

2. Discussion of Related Art

Recently, semiconductor devices used for embedded memory in the field of system ICs or SOC (System On Chip) have memory devices, such as DRAM, SRAM, flash memory and EEPROM, and logic elements for field applications formed on a semiconductor substrate. There is a need for manufacturing technology of semiconductor devices, wherein different elements are formed in two or more semiconductor substrates and the substrates are then stacked.

FIGS. 1a to 1c are cross-sectional views for explaining a conventional wafer alignment method.

Referring to FIG. 1a, an interlayer insulating film 12 is formed on a semiconductor substrate 10 having a memory device formed in. While a final metal line is formed on the interlayer insulating film 12, bonding pads 14 of the memory device, which are to be bonded to a semiconductor substrate 20 having a logic element formed in, are formed. A first protection film 16 is formed on the bonding pads 14 and is then selectively etched to expose predetermined portions of the bonding pads 14 of the memory device.

Referring to FIG. 1b, an interlayer insulating film 22 is formed on the semiconductor substrate 20 having the logic element formed in. While a final metal line is formed on the interlayer insulating film 22, bonding pads 24 of a logic element, which are to be bonded to the semiconductor substrate 10 having the memory device formed in, are formed. A second protection film 26 is formed on the bonding pads 24, and is then selectively etched to open the bonding pads 24 of the logic element.

Referring to FIG. 1c, in order to connect the semiconductor substrate 10 of the memory device and the semiconductor substrate 20 of the logic element, the semiconductor substrate 10 of the memory device and the semiconductor substrate 20 of the logic element are stacked so that the bonding pads 14 formed in the semiconductor substrate of the memory device and the bonding pads 24 formed in the semiconductor substrate of the logic element are in contact with each other in a state where a bottom surface of the semiconductor substrate 20 of the logic element is oriented upwardly.

Thereafter, the semiconductor substrate 10 of the memory device and the semiconductor substrate 20 of the logic element, which are stacked together, are annealed to electrically connect the bonding pads 14 formed in the semiconductor substrate of the memory device and the bonding pads 24 formed in the semiconductor substrate of the logic element.

If the semiconductor substrates respectively provided in the memory device and the logic element are stacked, however, a misalignment phenomenon frequently occurs. This makes difficult electrical connection of the semiconductor substrate in which the memory device is provided and the semiconductor substrate in which the logic element is provided.

SUMMARY OF THE INVENTION

Accordingly, the present invention has been made in view of the above problems, and it is an object of the present invention to provide a wafer alignment method in which misalignment of semiconductor substrates can be prevented when multi-layer semiconductor substrates in which semiconductor devices are formed are stacked in an aligned manner.

To achieve the above object, according to an aspect of the present invention, there is provided a wafer alignment method, including the steps of forming first bonding pads and first wafer alignment marks of a convex shape on predetermined regions of a first semiconductor substrate in which a first device is formed, forming second bonding pads on predetermined regions of a second semiconductor substrate in which a second device is formed so that they correspond to the first bonding pads, and forming second wafer alignment marks of a hall shape on the predetermined regions of the second semiconductor substrate so that they correspond to the wafer alignment marks of the convex shape, disposing a rear surface of the second semiconductor substrate upwardly, so that the first bonding pads of the first semiconductor substrate and the second bonding pads of the second semiconductor substrate correspond to each other, polishing the rear surface of the second semiconductor substrate, which is disposed upwardly, to form holes of the second wafer alignment marks through which X-rays to be projected later penetrate, aligning the first semiconductor substrate and the second semiconductor substrate so that the X-rays projected from the X-ray projector penetrate the second wafer alignment marks of the second semiconductor substrate and then reach the wafer alignment marks of the first semiconductor substrate through a X-ray sensing device, which has an X-ray projector and an X-ray detector and is adjacent to the rear surface of the second semiconductor substrate, and performing a thermal process on the first semiconductor substrate and the second semiconductor substrate, which are aligned, to electrically connect the first bonding pads and the second bonding pads.

Preferably, the alignment step of the first semiconductor substrate and the second semiconductor substrate, which is performed so that the X-rays projected from the X-ray projector penetrate the second wafer alignment marks of the second semiconductor substrate and then reach the wafer alignment marks of the first semiconductor substrate, is performed by detecting reflected light of the X-rays, which is reflected from the first wafer alignment marks of the convex shape, using the X-ray detector.

The second device can be a logic element, and the first device can be a memory device. The first wafer alignment marks are preferably formed to a thickness of about 8000 to 10000 Å in order to facilitate position detection through the projected X-rays. The first device can be a logic element, and the second device can be a memory device.

BRIEF DESCRIPTION OF THE DRAWINGS

FIGS. 1a to 1c are cross-sectional views for explaining a conventional wafer alignment method.

DETAILED DESCRIPTION OF PREFERRED EMBODIMENTS

Figure 1A:
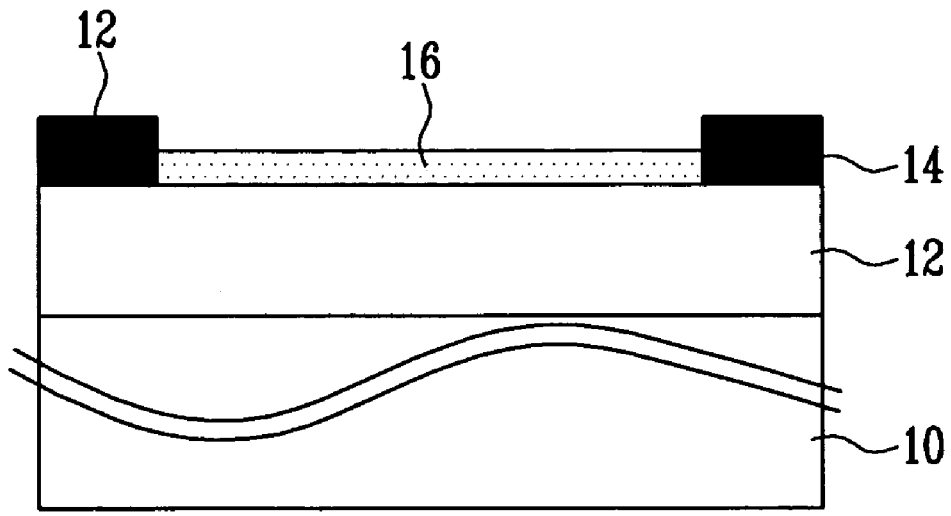
Figure 1B:
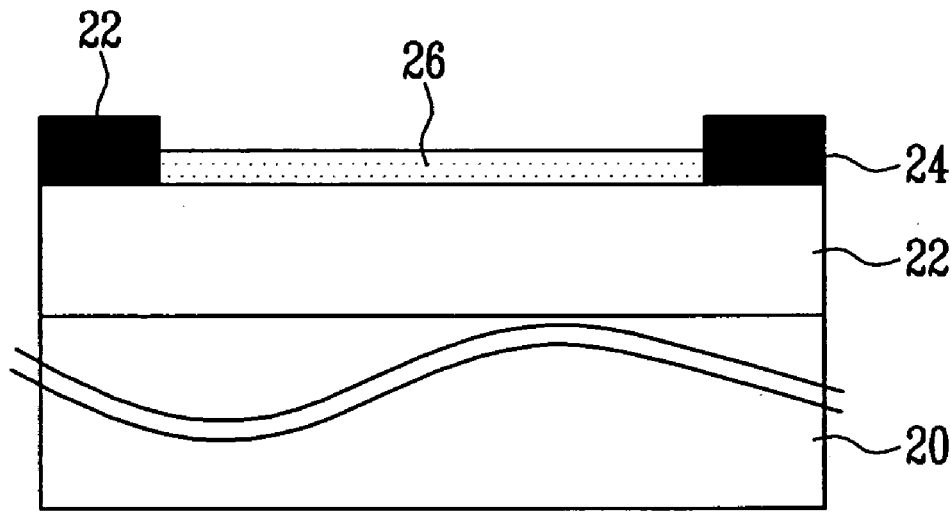

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 2 to 6 are cross-sectional views for explaining a wafer alignment method according to the present invention.

Figure 2A:
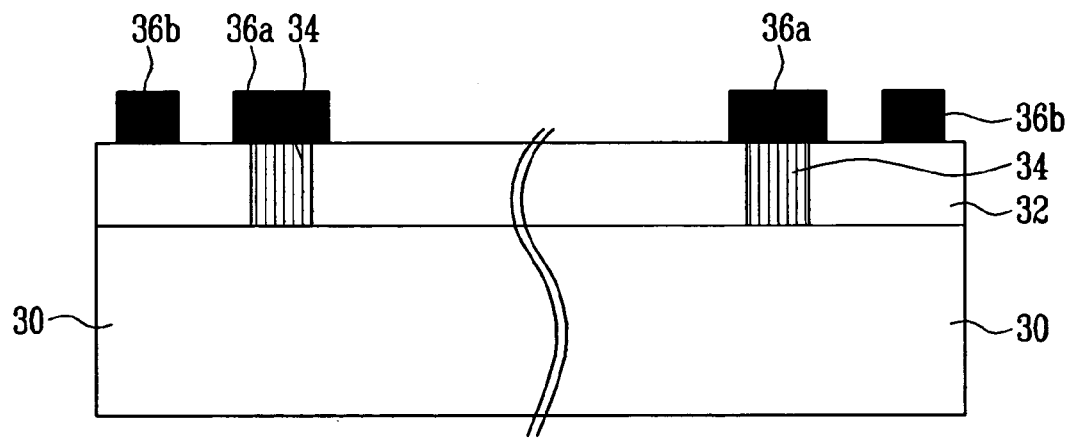
FIGS. 2 to 6 are cross-sectional views for explaining a wafer alignment method according to the present invention.
Figure 2B:
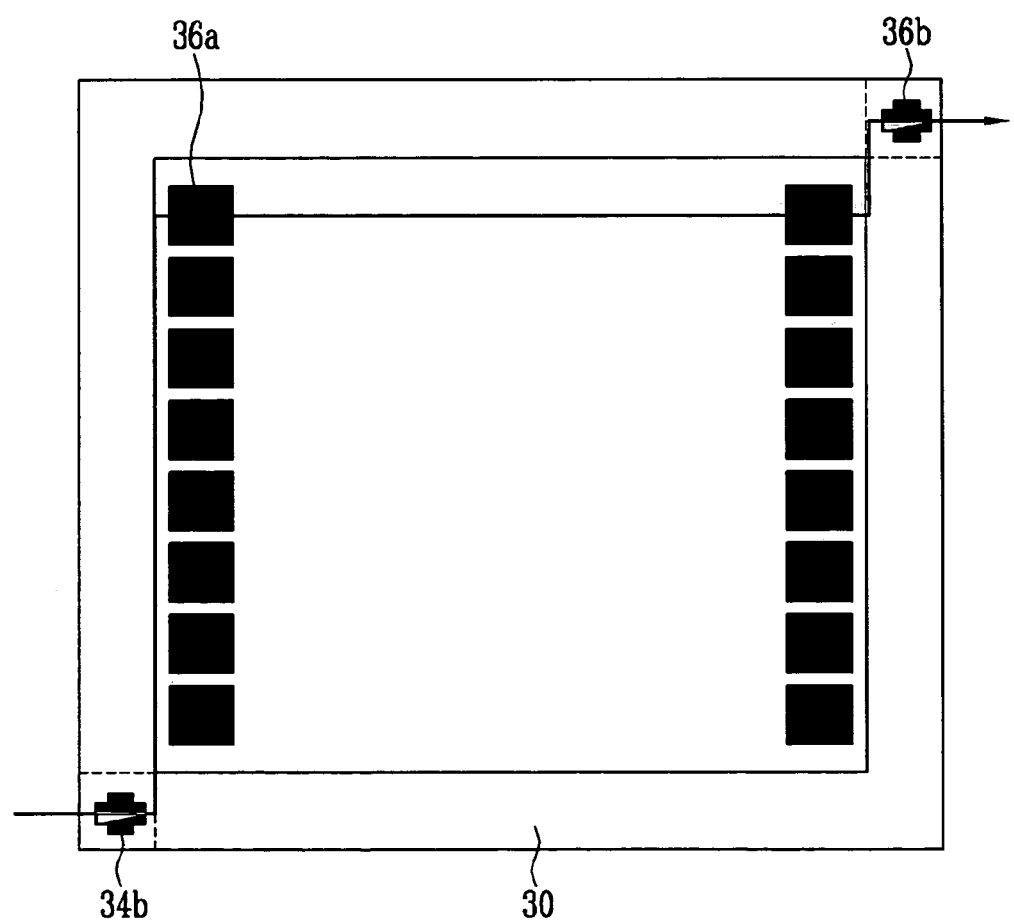

Referring to FIGS. 2a and 2b, a first interlayer insulating film 32 is formed on a first semiconductor substrate 30 in which a memory device (not shown) is formed. Predetermined regions of the first interlayer insulating film 32 are patterned to form first via holes 34. A multi-layer silicon film that constitutes a gate electrode of a transistor, a bit line, a capacitor, etc., a multi-layer metal line, and the like (which are not shown in the drawings) are formed under the first interlayer insulating film 32. Further, a contact hole for electrical connection of source/drain, a metal line, etc., are formed within the first interlayer insulating film 32.

After a metal line film is formed on the entire structure including the first via holes 34, a photolithography process is performed to form first bonding pads 36a, which are exposed through the first via holes 34 and then joined to the first semiconductor substrate 30, and first wafer alignment marks 36b of a convex shape at the same time.

The first wafer alignment marks 36b of the convex shape are two, one in the outermost diagonal direction of each of chips existing on the first semiconductor substrate 30. Therefore, the first wafer alignment marks 36b are used to align the first semiconductor substrate 30 and a second semiconductor substrate to be formed later, and also helps to align respective chips. In the case where a subsequent photolithography process is performed on a rear surface of each of the substrates, the metal line film is deposited on the entire surface of the second semiconductor substrate, and is then used to exactly connect lines formed in the first semiconductor substrate 30 and lines formed in the second semiconductor substrate.

The first wafer alignment marks 36b of the convex shape, which are formed in the first semiconductor substrate 30, has a cross shape in order to exactly align the right, left, up and down, has a size of 20 to 50 μm, and is internally located 5 to 10 μm from the leftmost outermost of the substrate. A process for forming the first wafer alignment marks 36b of the convex shape is performed simultaneously with the process of forming the first bonding pads 36a of the metal line patterning process. Thus, additional process cost is not caused.

Figure 3A:
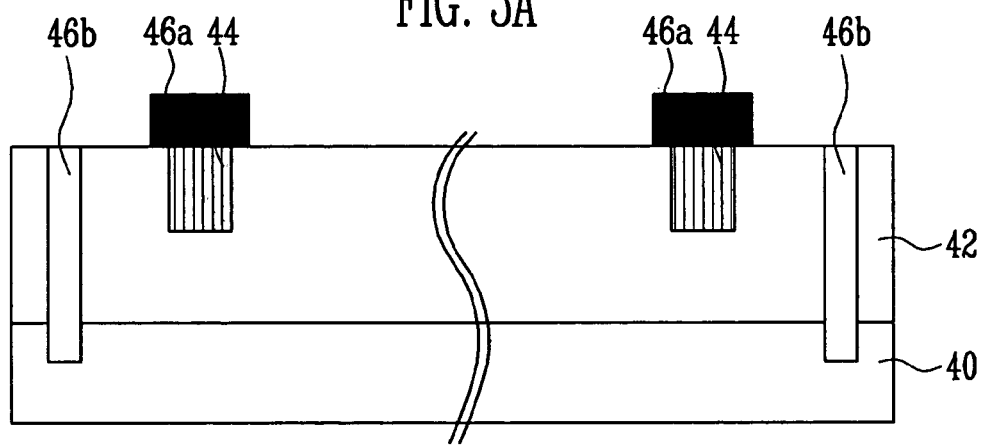
Figure 3B:
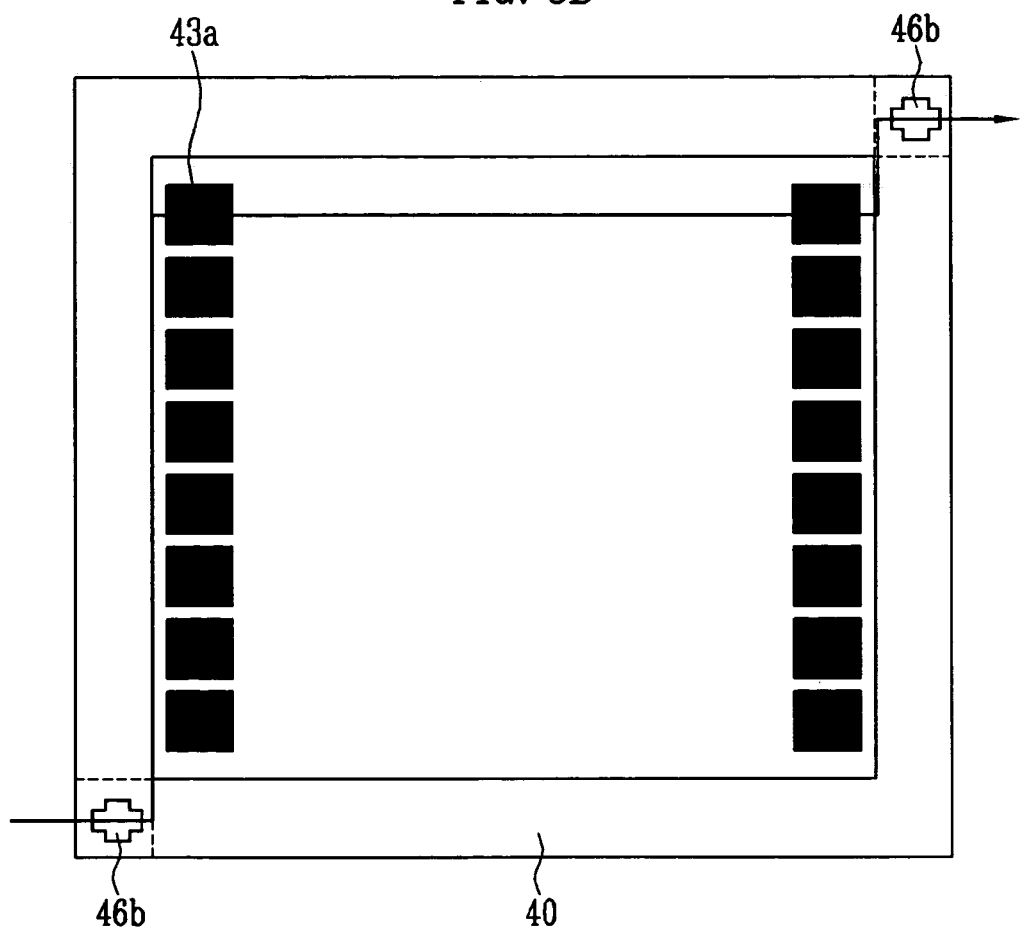

Referring to FIGS. 3a and 3b, a second interlayer insulating film 42 is formed on a second semiconductor substrate 40 in which a logic element (not shown) is formed. Predetermined regions of the second interlayer insulating film 42 are patterned to form second via holes 44. A multi-layer silicon film that constitutes a gate electrode of a transistor, a bit line, a capacitor, etc., a multi-layer metal line, and the like (which are not shown in the drawings) are formed under the second interlayer insulating film 42. Further, a contact hole for electrical connection of source/drain, a metal line, etc., are formed within the second interlayer insulating film 42.

After a metal line film is formed on the entire structure including the second via holes 44, a photolithography process is performed to form second bonding pads 46a, which are exposed through the second via holes 44 and then joined to the second semiconductor substrate 40.

A photolithography process is performed on predetermined regions of the second semiconductor substrate 40 on which the second bonding pads 46a process is completed, thus forming second wafer alignment marks 46b of a hall shape. In this case, the two second wafer alignment marks 46b of the hall shape are respectively formed at the outermost of each of chips in the outermost diagonal direction of each of the chips so that they correspond to the first wafer alignment marks 36b of the convex shape of the first semiconductor substrate 30. In this case, the second wafer alignment marks 46b have a cross shape, have a size of 20 to 50 μm, and are internally located 5 to 10 μm from the leftmost outermost of the substrate, in the same manner as that of the first wafer alignment marks 36b of the convex shape.

Figure 4:
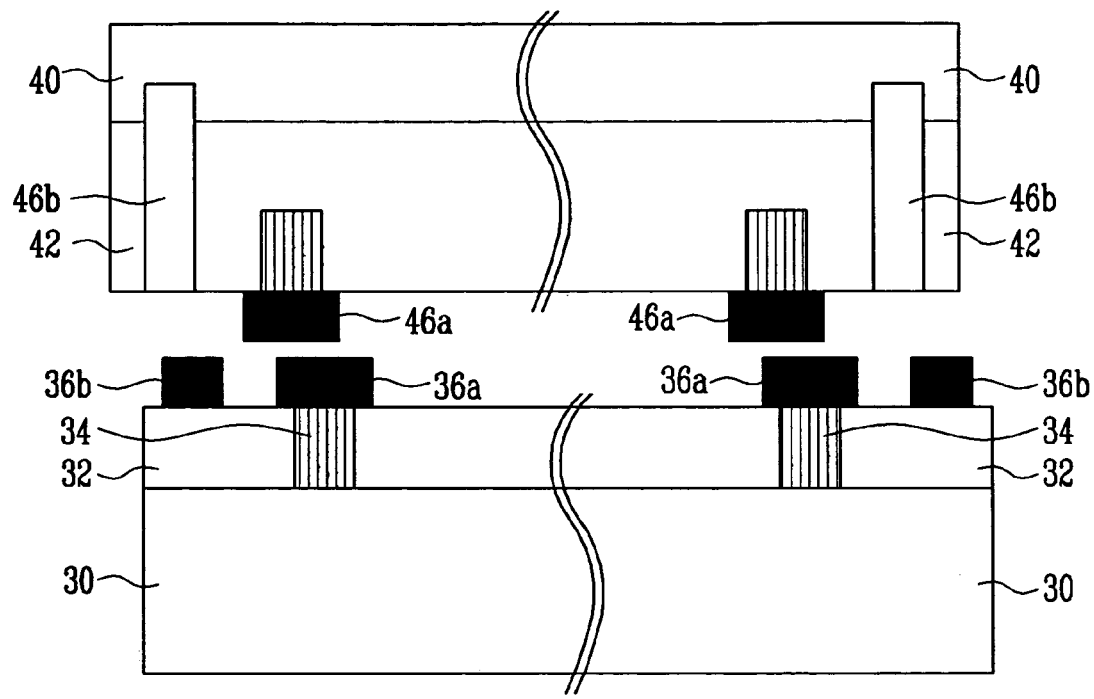

Referring to FIG. 4, the first semiconductor substrate 30 and the second semiconductor substrate 40 are pre-aligned so that the first bonding pads 36a of the first semiconductor substrate 30 and the second bonding pads 46a of the second semiconductor substrate 40, for electrically connecting the memory device and the logic element respectively formed on the first semiconductor substrate 30 and the second semiconductor substrate 40, are connected in a state where a rear surface of the second semiconductor substrate 40 is oriented upwardly.

Figure 5:
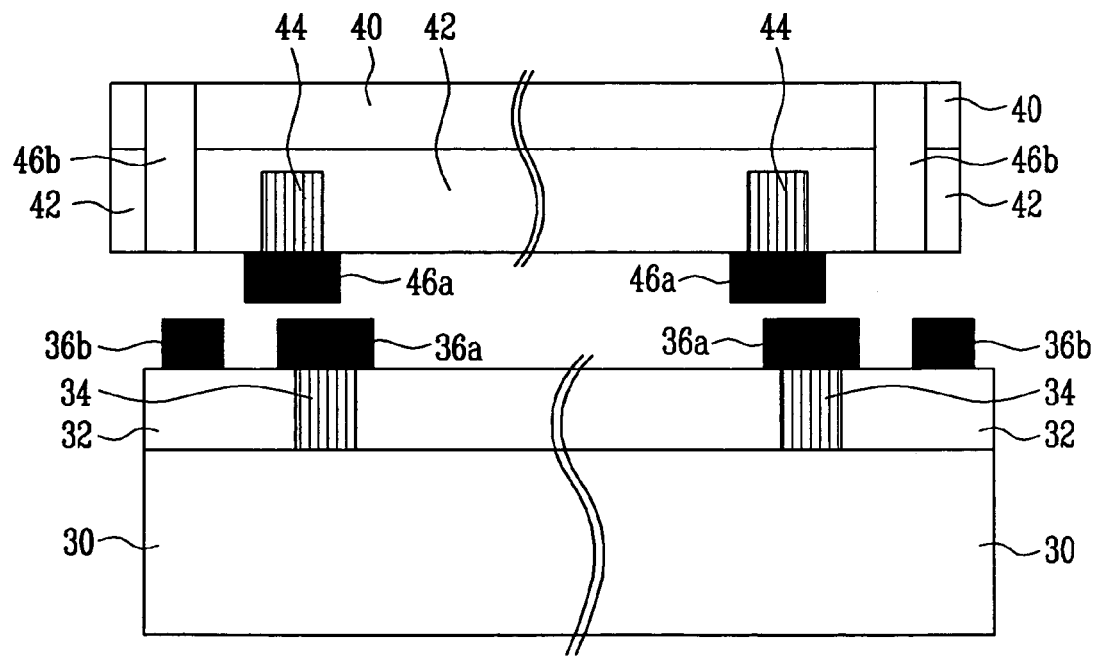

Referring to FIG. 5, the first semiconductor substrate 30 is fixed to the results in which the first semiconductor substrate 30 and the second semiconductor substrate 40, which are pre-aligned, are provided in a vacuum state. The rear surface of the second semiconductor substrate 40 is polished so that the second wafer alignment marks 46b of the hall shape are exposed through a first back grind apparatus and a CMP apparatus.

Figure 6:
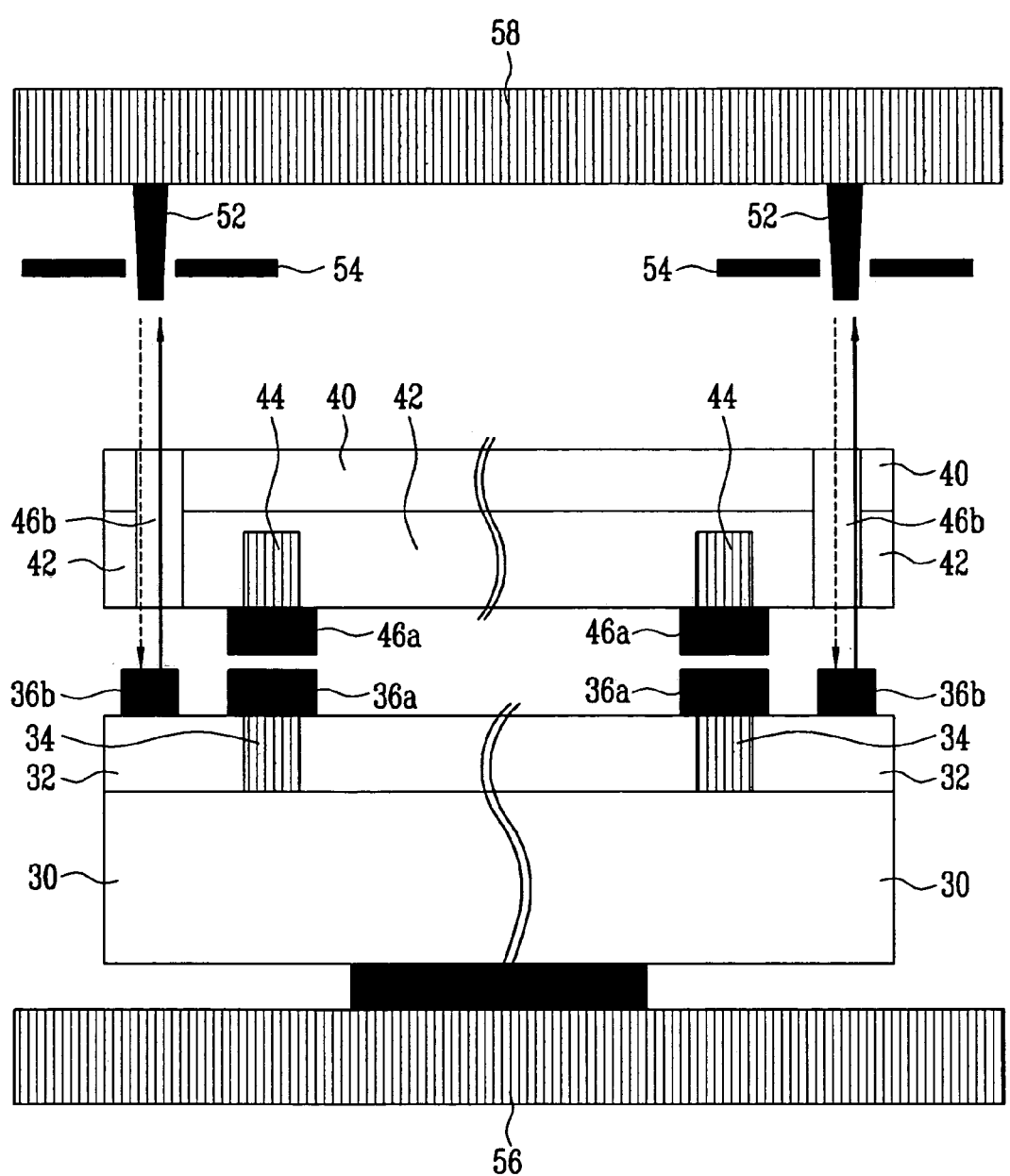

Referring to FIG. 6, the first semiconductor substrate 30 is fixed to a wafer stage 56 in a vacuum state. An X-ray sensing device 58 has an X-ray projector 52 and an X-ray detector 54. The X-ray projector 52 projects X-rays having a waveform of 4 to 50 μm toward the wafer alignment marks 36b that exist on the top or the rightmost and leftmost sides of the first semiconductor substrate 30 through the second wafer alignment marks 46b of the hall shape, which are exposed on the rear surface of the second semiconductor substrate 40. The X-ray reflected light reflected from the first wafer alignment marks 36b of the convex shape is detected by means of an X-ray detector 54.

If the X-ray projector 52 and the first wafer alignment marks 36b are not correctly aligned, X-rays projected from the X-ray projector 52 are absorbed into the air not metal, or reflect from the first interlayer insulating film 32, etc. of the first semiconductor substrate 30 having different reflexibility. In this case, since 100% reflected light does not reach the X-ray detector 54, a point where 100% reflected light reaches is found by positioning the X-ray projector 52 right and left or up and down.

If 100% reflected light exactly reaches the X-ray detector 54 by correcting and realigning the position of the first semiconductor substrate 30 after repeating the above process, the first bonding pads 36a of the first semiconductor substrate 30 and the second bonding pads 46a of the second semiconductor substrate 40 are exactly aligned by moving the X-ray sensing device 58 attached to the rear surface of the second semiconductor substrate 40 in a vacuum state. After the first semiconductor substrate 30 and the second semiconductor substrate 40 are correctly aligned, a thermal process is performed at a temperature of about 300 to 500°

C. to electrically connect the first bonding pads 36a being final metal lines of the first semiconductor substrate 30 and the second bonding pads 46a being final metal lines of the second semiconductor substrate 40, thereby completing the present process.

As described above, the method according to the present invention can be applied to a higher-integration memory process using lamination technology of semiconductor devices as well as a manufacturing process of complex semiconductor device of a memory device and a logic element.

According to the present invention, after two more semiconductor devices are formed on different semiconductor substrates, convex and hall-shaped wafer alignment marks are respectively formed on the semiconductor substrates, and the semiconductor substrates are laminated by means of an X-ray sensing method. Accordingly, the present invention is advantageous in that it can prevent misalignment of semiconductor substrates when multi-layer semiconductor substrates having semiconductor devices formed in are aligned.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A wafer alignment method, comprising the steps of:
    forming first bonding pads and first wafer alignment marks of a convex shape on predetermined regions of a first semiconductor substrate in which a first device is formed;
    forming second bonding pads on predetermined regions of a second semiconductor substrate in which a second device is formed so that they correspond to the first bonding pads, and forming second wafer alignment marks of a hall shape on the predetermined regions of the second semiconductor substrate so that they correspond to the wafer alignment marks of the convex shape;
    disposing a rear surface of the second semiconductor substrate upwardly, so that the first bonding pads of the first semiconductor substrate and the second bonding pads of the second semiconductor substrate correspond to each other;
    polishing the rear surface of the second semiconductor substrate, which is disposed upwardly, to form holes of the second wafer alignment marks through which X-rays to be projected later penetrate;
    aligning the first semiconductor substrate and the second semiconductor substrate so that the X-rays projected from the X-ray projector penetrate the second wafer alignment marks of the second semiconductor substrate and then reach the wafer alignment marks of the first semiconductor substrate through a X-ray sensing device, which has an X-ray projector and an X-ray detector and is adjacent to the rear surface of the second semiconductor substrate; and
    performing a thermal process on the first semiconductor substrate and the second semiconductor substrate, which are aligned, to electrically connect the first bonding pads and the second bonding pads.

2. The wafer alignment method as claimed in claim 1, wherein the alignment step of the first semiconductor substrate and the second semiconductor substrate, which is performed so that the X-rays projected from the X-ray projector penetrate the second wafer alignment marks of the second semiconductor substrate and then reach the wafer alignment marks of the first semiconductor substrate, is performed by detecting reflected light of the X-rays, which is reflected from the first wafer alignment marks of the convex shape, using the X-ray detector.

3. The wafer alignment method as claimed in claim 1, wherein the second device is a logic element, and the first device is a memory device.

4. The wafer alignment method as claimed in claim 1, wherein the first wafer alignment marks are formed to a thickness of about 8000 to 10000 Å in order to facilitate position detection through the projected X-rays.

5. The wafer alignment method as claimed in claim 1, wherein the first device is a logic element, and the second device is a memory device.

* * * * *